(12) United States Patent
Rosen

(10) Patent No.: US 9,124,266 B1
(45) Date of Patent: Sep. 1, 2015

(54) INCREASING SWITCHING SPEED OF LOGIC CIRCUITS

(71) Applicant: Marvell Israel (M.I.S.L) Ltd., Yokneam (IL)

(72) Inventor: Eitan Rosen, Abirim (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 14/014,127

(22) Filed: Aug. 29, 2013

Related U.S. Application Data

(60) Provisional application No. 61/695,509, filed on Aug. 31, 2012, provisional application No. 61/706,535, filed on Sep. 27, 2012.

(51) Int. Cl.
| | |
|---|---|
| *H03K 19/00* | (2006.01) |
| *H03K 19/01* | (2006.01) |
| *H03K 19/003* | (2006.01) |
| *H03K 19/096* | (2006.01) |
| *H03K 3/00* | (2006.01) |
| *H03K 19/0175* | (2006.01) |

(52) U.S. Cl.
CPC .............. *H03K 19/017509* (2013.01)

(58) Field of Classification Search
USPC ...................... 326/17, 18, 93, 95, 98
See application file for complete search history.

(56) References Cited

U.S. PATENT DOCUMENTS

| | | | | |
|---|---|---|---|---|
| 4,779,013 | A * | 10/1988 | Tanaka | 326/27 |
| 5,646,557 | A | 7/1997 | Runyon et al. | |
| 5,936,429 | A * | 8/1999 | Tomita | 326/82 |
| 6,069,496 | A | 5/2000 | Perez | |
| 6,249,147 | B1 * | 6/2001 | Vinh et al. | 326/86 |
| 6,462,582 | B1 | 10/2002 | Forbes | |
| 6,617,911 | B2 | 9/2003 | Bazes | |
| 6,833,743 | B2 | 12/2004 | Gu et al. | |
| 7,471,115 | B2 | 12/2008 | Bernstein et al. | |
| 7,492,203 | B2 * | 2/2009 | Kim | 327/218 |
| 7,508,242 | B2 * | 3/2009 | Tokuno | 327/108 |

* cited by examiner

*Primary Examiner* — Alexander H Taningco
*Assistant Examiner* — Christian L Garcia

(57) ABSTRACT

Some of the embodiments of the present disclosure provide a method comprising outputting data at a logic circuit; and in anticipation of a possible change in the data during a data window, applying at least a partial inversion to an output of the logic circuit from a start of the data window.

19 Claims, 9 Drawing Sheets

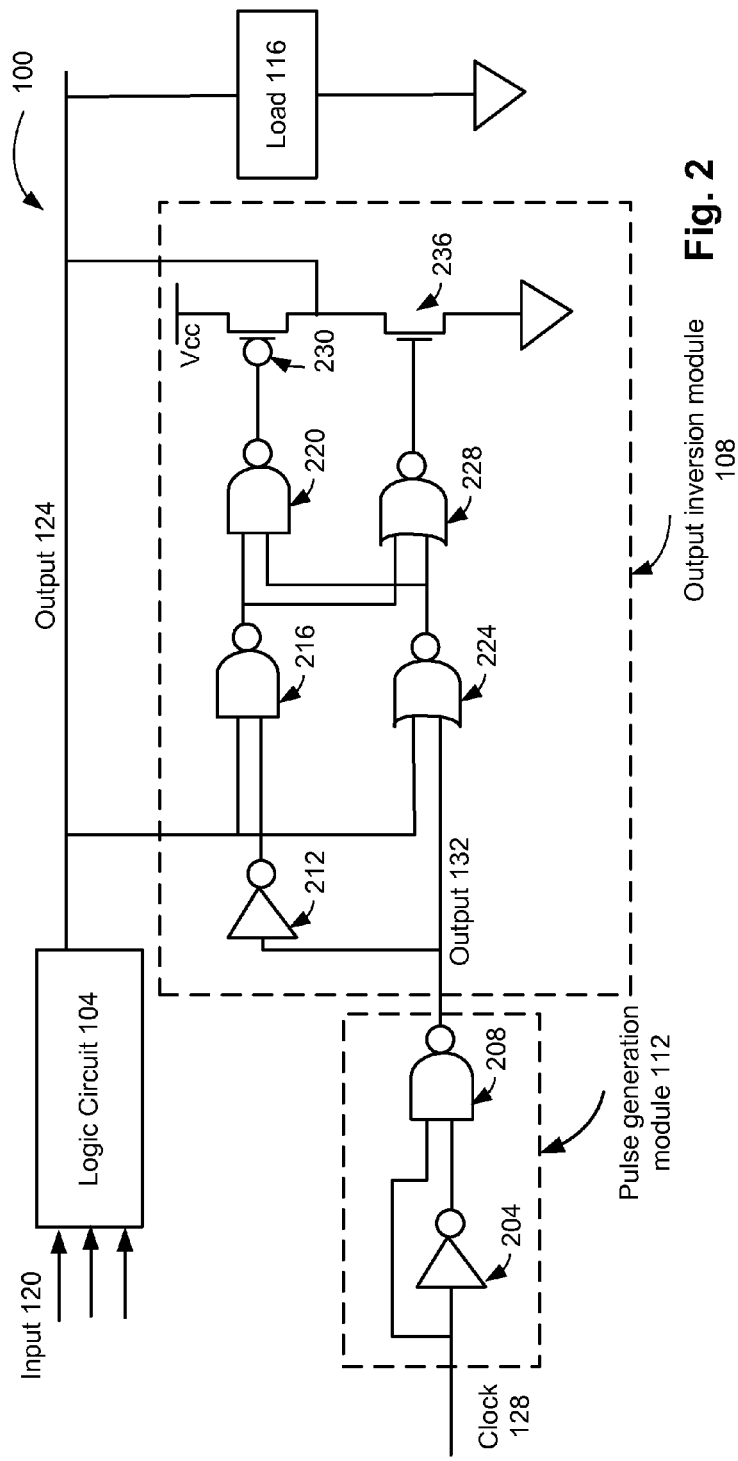
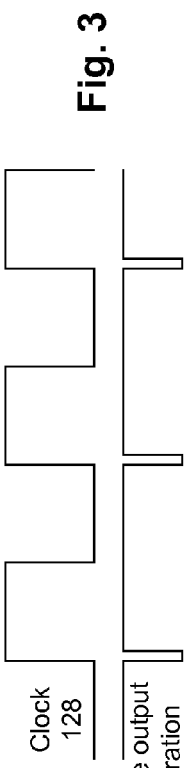

INCREASING SWITCHING SPEED OF LOGIC CIRCUITS

CROSS REFERENCE TO RELATED APPLICATIONS

The present disclosure claims priority to U.S. Provisional Patent Application No. 61/695,509, filed Aug. 31, 2012, and to U.S. Provisional Patent Application No. 61/706,535, filed Sep. 27, 2012, which are incorporated herein by reference. The present disclosure is also related to U.S. patent application Ser. No. 14/014,043, filed concurrently with the present application on Aug. 29, 2013, which is incorporated herein by reference.

TECHNICAL FIELD

Embodiments of the present disclosure relate to logic circuits, and more particularly, to increasing switching speed of logic circuits.

BACKGROUND

Unless otherwise indicated herein, the approaches described in this section are not necessarily prior art to the claims in the present disclosure and are not admitted to be prior art by inclusion in this section.

A logic circuit comprises various logic elements, logic gates, digital circuit elements, and/or the like. An output of a logic circuit may be configured to change from a start of a clock cycle. However, the change in the output of a conventional logic circuit can be delayed (e.g., the change in the output of the conventional logic circuit may start after a delay from the start of the clock cycle) due to various factors, including but not limited to, low driving capacity of the logic circuit, large size of the logic circuit, slow response time of the logic circuit, inherent parasitic capacitance of the logic circuit, delay in change in an input to the logic circuit, and/or the like. Thus, a conventional logic circuit may have slower switching speed.

SUMMARY

In various embodiments, the present disclosure provides a method comprising outputting data at a logic circuit; and in anticipation of a possible change in the data during a data window, applying at least a partial inversion to an output of the logic circuit from a start of the data window.

In various embodiments, the present disclosure also provides a system comprising a logic circuit configured to output data; and an output inversion module coupled to an output of the logic circuit, the output inversion module configured to: in anticipation of a possible change in the data during a data window, apply at least a partial inversion to an output of the logic circuit from the start of the data window.

In various embodiments, the present disclosure also provides a circuit comprising a logic circuit configured to (i) receive one or more input signals, and (ii) provide an output in response to the one or more input signals; an inverting logic gate coupled to the output of the logic circuit; and a pair of complementary transistors (i) coupled to the output of the logic circuit and (ii) arranged in a negative feedback loop surrounding the inverting logic gate, so as to by divert charge/discharge current from the output of the logic circuit without loading the inverting logic gate.

BRIEF DESCRIPTION OF THE DRAWINGS

In the following detailed description, reference is made to the accompanying drawings, which form a part hereof. Like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIG. 2 illustrates an example implementation of the system of FIG. 1, in accordance with an embodiment.

FIG. 3 illustrates a timing diagram including a clock signal and an output of a pulse generation module, in accordance with an embodiment.

DETAILED DESCRIPTION

Figure 1:
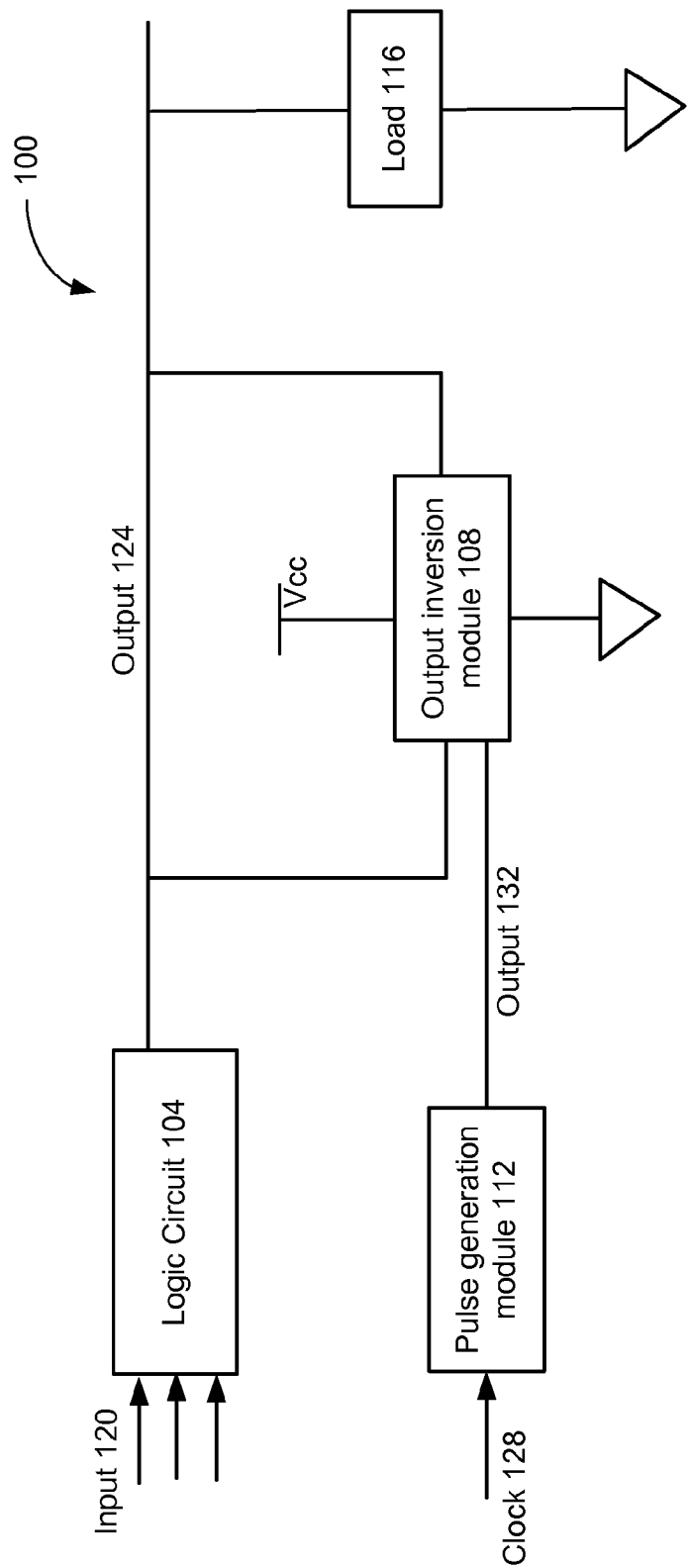
FIG. 1 schematically illustrates a system comprising (i) a logic circuit and (ii) an output inversion module configured to selectively partially invert an output of the logic circuit and increase a speed at which the output of the logic circuit changes, in accordance with an embodiment.

FIG. 1 schematically illustrates a system 100 comprising (i) a logic circuit 104 and (ii) an output inversion module 108 configured to selectively partially invert an output of the logic circuit 104 and increase a speed at which the output of the logic circuit 104 changes (i.e., increases a switching speed the logic circuit). The logic circuit 104 receives one or more input signals, labeled as input 120 in FIG. 1. Based on input 120, the logic circuit 104 drives an output 124 of the logic circuit 104. The logic circuit 104 can be any appropriate type of logic circuit comprising various logic elements, logic gates, digital circuit elements, and/or the like. A load 116 is coupled to the output 124 of the logic circuit 104. In an embodiment, the load 116 is a capacitive load and comprises, for example, a buffer, a memory, and/or the like.

In an embodiment, the logic circuit 104 is relatively slow in changing the output 124 of the logic circuit 104. For example, based on the input 120, the logic circuit 104 may need to change the output 124 from a low voltage level to a high voltage level from a start of a clock signal. However, due to, for example, low driving capacity of the logic circuit 104, size (i.e. number of inputs) of the logic circuit, slow response time of the logic circuit 104, inherent parasitic capacitance of the logic circuit 104, delay in change in the input 120, and/or the like, the logic circuit 104 may start changing the output 124 to the high voltage level after some delay from the start of the clock cycle. In a complex and high frequency system, such a delay in changing the output 124 of the logic circuit 104 is generally not desirable.

In an embodiment, in anticipation of a possible change in the output 124 during a clock cycle, the output inversion module 108 applies at least a partial inversion to the output 124 of the logic circuit 104 from the start of the clock cycle. In an example, prior to the start of the clock cycle, the output 124 of the logic circuit 104 is at a first voltage level (e.g., which corresponds to a logical value of 1). In anticipation of the possible change in the output 124 during the clock cycle from the first voltage level to a second voltage level (e.g., which corresponds to a logical value of 0), the output inversion module 108 applies the partial inversion to the output 124 of the logic circuit 104 from the start of the clock cycle, such that the output 124 changes from the first voltage level to a third voltage level, where the third voltage level is between the first voltage level and the second voltage level. Thus, the partial inversion refers to a change of the output 124 from the first voltage level to the third voltage level, while a full inversion refers to a change of the output 124 from the first voltage level to the third voltage level. If the logic circuit 104 is to actually drive the output 124 to the second voltage level during the clock cycle, the system 100 continues the partial inversion to a full inversion of the output 124, such that the output 124 is fully inverted from the first voltage level to the second voltage level. On the other hand, If the logic circuit 104 is not to drive the output 124 to the second voltage level during the clock cycle (i.e., maintain the output 124 at the first voltage level), the system 100 reverts the partial inversion to the output 124, such that the output 124 reverts back from the third voltage level to the first voltage level. Thus, the partial inversion of the output 124, performed by the output inversion module 108 from the start of the clock cycle, is done prior to the output inversion module 108 knowing whether the logic circuit 104 is going to change the output 124 during the clock cycle. If the voltage level of the output 104 is to actually change from the first voltage level to the second voltage level, the partial inversion of the output 124 aids in changing the voltage level of the output 104 from the first voltage level to the second voltage level relatively faster (e.g., compared to a situation in which the output inversion module 108 was absent), thereby increasing a switching speed of the logic circuit 104.

In an embodiment, the system 100 further comprises a pulse generation module 112 configured to (i) receive a clock signal 128 (henceforth referred to as clock 128) and (ii) generate an output 132, such that the output 132 comprises a series of pulses indicating a start of a corresponding series of clock cycles of the clock 128. Based on receiving the pulse in the output 132, the output inversion module 108 applies the partial inversion to the output 124 of the logic circuit 104 from the start of the clock cycles of the clock 128.

FIG. 2 illustrates an example implementation of the system 100 of FIG. 1. In an embodiment, the pulse generation module 112 comprises an inverter 204 configured to receive the clock 128. The pulse generation module 112 further comprises a NAND gate 208, which receives (i) the clock 128 and (ii) an output of the inverter 204. An output of the NAND gate 208 (i.e., the output 132) forms the output of the pulse generation module 112. FIG. 3 illustrates a timing diagram including the clock 128 and the output 132 (i.e., the output of the pulse generation module 112).

During a start of each clock cycle of the clock 128, the NAND gate 208 outputs a pulse. For example, when the clock 128 is 1 for at least a period of time, the output of the inverter 204 is 0 and the output of the NAND gate 208 (i.e., the output 132) is 1, as illustrated in FIG. 3. Similarly, when the clock 128 is 0 for at least a period of time, the output of the inverter 204 is 1 and the output of the NAND gate 208 (i.e., the output 132) is also 1, as illustrated in FIG. 3. However, while the clock 128 is transitioning or just transitioned from 0 to 1 (i.e., during a rising edge of the clock 128), the output of the inverter 204 is still 1 (e.g., due to a delay in the inverter 204). Accordingly, while the clock 128 is transitioning or just transitioned from 0 to 1 (i.e., during the rising edge of the clock 128), the output of the NAND gate 208 gate (i.e., the output 132) momentarily becomes 0, thereby generating a negative pulse indicating a rising edge of the clock cycle, as illustrated in FIG. 3.

Referring again to FIGS. 1 and 2, the output inversion module 108 comprises an inverter 212 configured to receive the output 132 from the pulse generation module 112. The output inversion module 108 further comprises a NAND gate 216 configured to receive (i) the output 124 and (ii) an output of the inverter 212. The output inversion module 108 further comprises a NOR gate 224 configured to receive (i) the output 124 and (ii) the output 132 from the pulse generation module 112. In an embodiment, the NAND gate 216 has a relatively low skew and a relatively low trip point, and the NOR gate 224 has a relatively high skew and a relatively high trip point.

The output inversion module 108 further comprises a NAND gate 220 configured to receive (i) an output of the NAND gate 216 and (ii) an output of the NOR gate 224. The output inversion module 108 further comprises a NOR gate 228 configured to receive (i) the output of the NAND gate 216 and (ii) the output of the NOR gate 224.

The output inversion module 108 further comprises a transistor 230 (e.g., a P-channel MOSFET, i.e., a PMOS transistor) configured to have a source terminal coupled to a source voltage VCC, a drain terminal coupled to the output 124, and a gate terminal coupled to an output of the NAND gate 220. The output inversion module 108 further comprises a transistor 236 (e.g., an N-channel MOSFET, i.e., a NMOS transistor) configured to have a source terminal coupled to the output 124 (and also to the drain terminal of the transistor 230), a drain terminal coupled to a ground, and a gate terminal coupled to an output of the NOR gate 228.

FIGS. 4A-4D are timing diagrams illustrating operations of the system 100. Each of FIGS. 4A-4D illustrates a behavior of the system 100 during and subsequent to a rising edge of a corresponding single clock cycle. In each of FIGS. 1, 2 and 4A, at time t0, the clock 128 has a rising edge, resulting in a pulse in the output 132 indicating the rising edge of the clock cycle. The negative pulse in the output 132 lasts substantially from time t0 to time t1, as indicated in each of FIGS. 4A-4D.

Each of FIGS. 4A-4D also illustrates the output 124 and an internal output of the logic circuit 104. The internal output of the logic circuit 104 changes based on the input 120. For purposes of discussion, each of the internal output of the logic circuit 104 and the output 124 is assumed to be either in a low voltage level (which corresponds to, for example, logical value of 0) or a high voltage level (which corresponds to, for example, logical value of 1) during steady state, although during transitions each of these two signals varies between the low and high voltage levels.

Ideally, if the internal output of the logic circuit 104 is to change at the clock cycle illustrated in FIGS. 4A-4D, the change should occur at time t0 (i.e., when the clock cycle starts). However, due to various factors (e.g., low driving capacity of the logic circuit 104, slow response time of the logic circuit 104, delay in change in the input 120, latency in the logic circuit 104, parasitic capacitance of the logic circuit 104, etc.), the internal output of the logic circuit 104 starts changing slowly and with a delay (i.e., starts changing after some has elapsed from time t0).

Figure 4A:
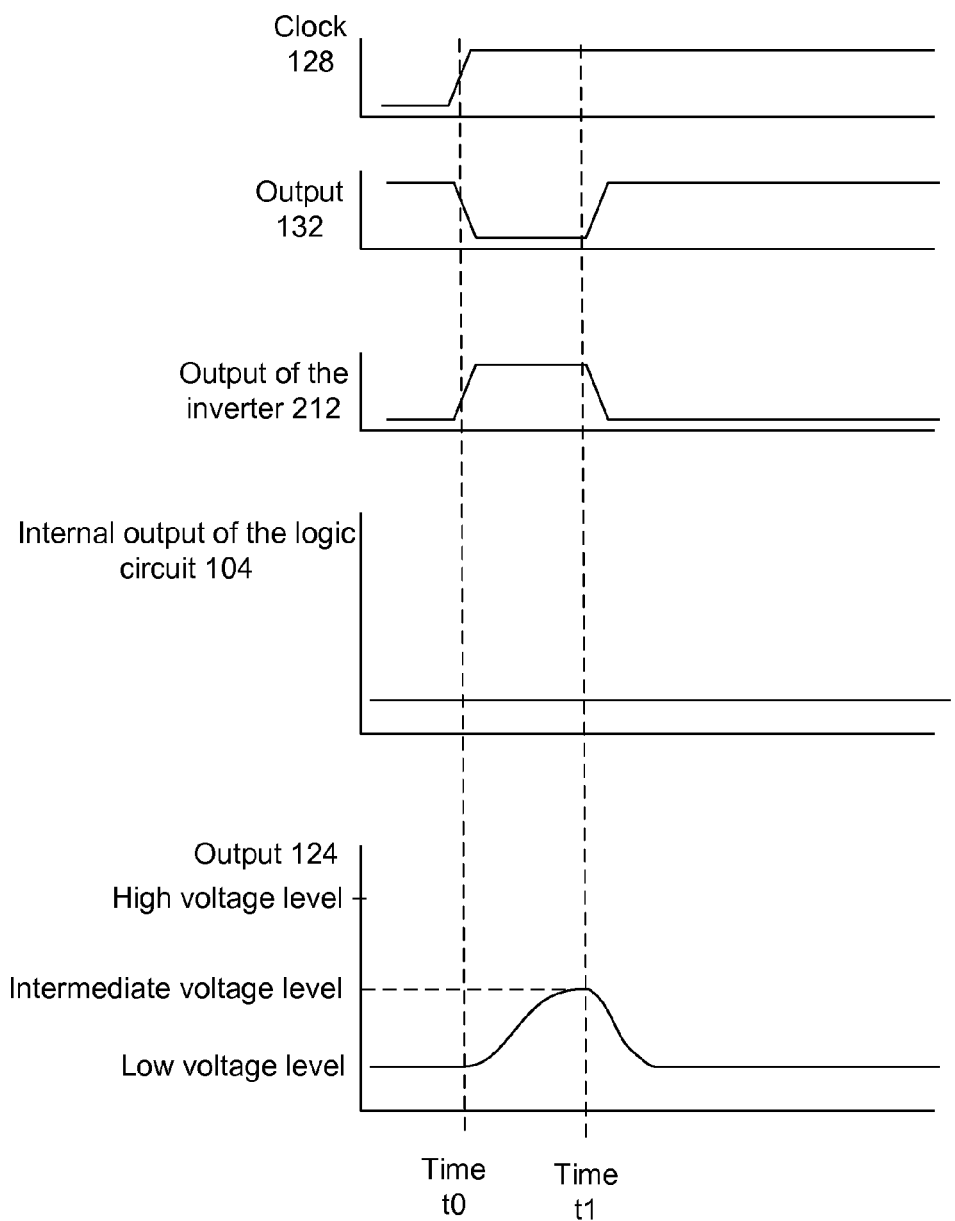
FIGS. 4A-4D are timing diagrams illustrating operations of the system of FIG. 1, in accordance with an embodiment.
Figure 4B:
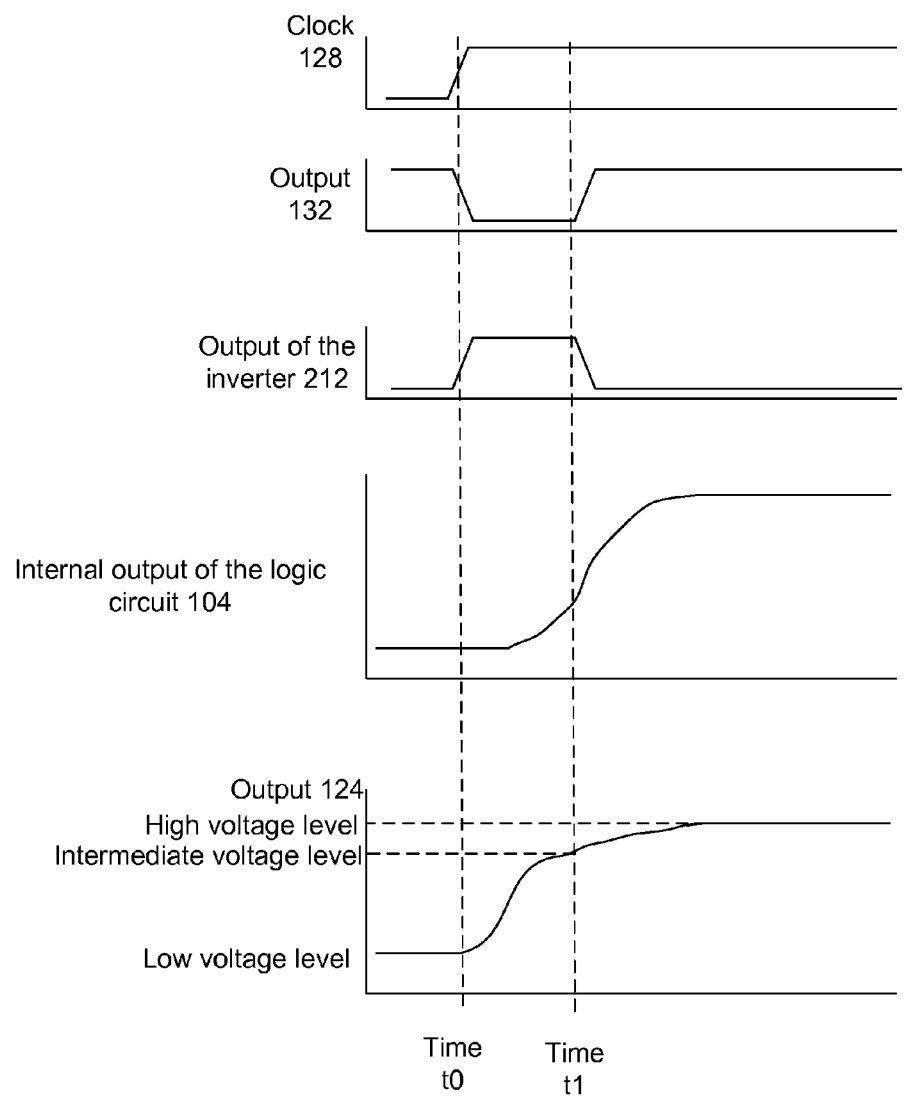
Figure 4C:
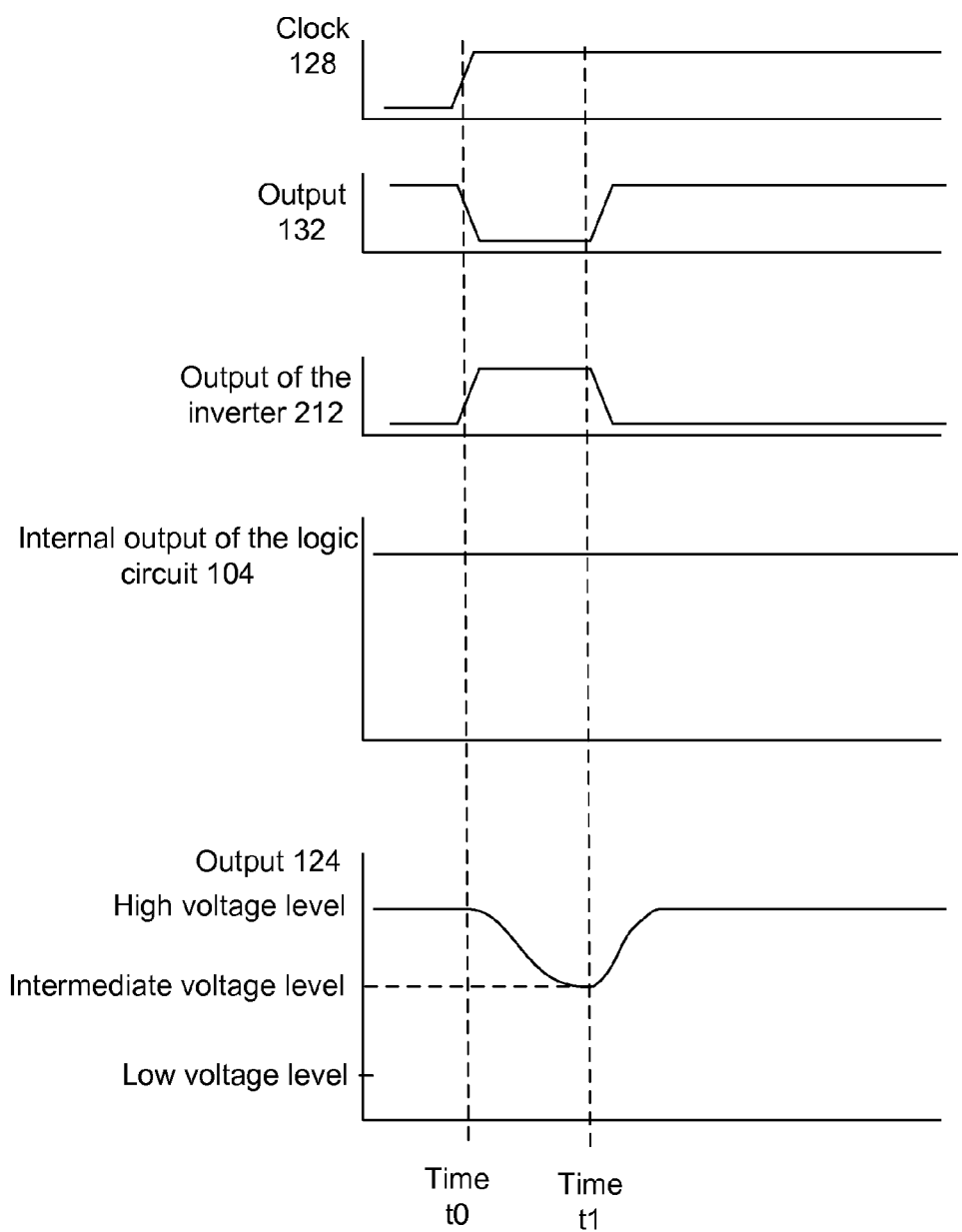

In FIG. 4A, the internal output of the logic circuit 104 is at the low voltage level prior to time t0 (i.e., prior to the start of the clock cycle), and does not change during the clock cycle. In FIG. 4B, the internal output of the logic circuit 104 is at the low voltage level prior to time t0, and changes to the high voltage level during the clock cycle. In FIG. 4C, the internal output of the logic circuit 104 is at the high voltage level prior to time t0, and does not change during the clock cycle. In FIG. 4B, the internal output of the logic circuit 104 is at the high voltage level prior to time t0, and changes to the low voltage level during the clock cycle.

Referring again to FIGS. 1, 2 and 4A, prior to time t0, the output 124 is at the low voltage level (e.g., as the internal output of the logic circuit 104 is at the low voltage level prior to time t0). Immediately after time t0 (e.g., between time t0 and time t1), the output 132 is 0 (e.g., due to the negative pulse indicating a start of the clock cycle, as discussed with respect to FIG. 3), resulting in the output of the inverter 212 being 1. Also, output 124 is still at the low voltage level (e.g., as the internal output of the logic circuit 104 has not driven the output 124 to a different voltage level). Thus, between time t0 and time t1, the output of the NAND gate 216 is 1 and the output of the NOR gate 224 is also 1. Accordingly, between time t0 and time t1, the output of each of the NAND gate 220 and the NOR gate 228 is 0. Accordingly, substantially at or immediately after time t0, the P channel transistor 230 turns on (while the N-channel transistor 236 remains off), thereby gradually driving the output 124 to an intermediate voltage level (e.g., using the voltage VCC), where the intermediate voltage level is between the high and low voltage levels of the output 124, as illustrated in FIG. 4A.

Also, as previously discussed, in the embodiment of FIG. 4A, the internal output of the logic circuit 104 remains at the low voltage level throughout the clock cycle (i.e., the output of the logical circuit 104 is not supposed to change during the clock cycle). Accordingly, after time t1 (i.e., when the negative pulse of the output 132 ends), the output 132 becomes 1, the output of the inverter 212 becomes 0, and the output of the NAND gate 216 remains 1. Accordingly, from substantially time t1, the output of the NOR gate 224 becomes 0. Hence, from substantially time t1, the output of the NAND gate 220 becomes 1 and the P-channel transistor 230 turns off. Accordingly, the transistor 230 is unable to further drive or sustain the intermediate voltage of the output 124, and the voltage of the output 124 gradually decreases to the low voltage level (e.g., based on the internal output of the logic circuit 104 being at the low voltage), as illustrated in FIG. 4A. Also, the output of the NOR gate 228 remains 0 and the N-channel transistor 236 remains off.

Referring now to FIGS. 1, 2 and 4B, prior to time t0, the output 124 is at the low voltage level. Immediately after time t0 (e.g., between time t0 and time t1), the output 132 is 0 (e.g., due to the negative pulse indicating a start of the clock cycle, as discussed with respect to FIG. 3), resulting in the output of the inverter 212 being 1. Also, output 124 is still at the low voltage level (e.g., as the internal output of the logic circuit 104 has yet not driven the output 124 to a sufficiently high voltage level). Thus, between time t0 and time t1, the output of the NAND gate 216 is 1 and the output of the NOR gate 224 is also 1 (e.g., as the NOR gate 224 has a relatively high trip point). Accordingly, between time t0 and time t1, the output of each of the NAND gate 220 and the NOR gate 228 is 0. Accordingly, substantially at or immediately after time t0, the P channel transistor 230 turns on (while the N-channel transistor 236 remains off, e.g., as the output of each of the NAND gate 220 and the NOR gate 228 is 0), thereby gradually driving the output 124 to an intermediate voltage level (e.g., using the voltage VCC), where the intermediate voltage level is between the high and low voltage levels of the output 124. It is to be noted that the behavior of various logic gates from time t0 to time t1 is similar for both the FIGS. 4A and 4B.

Also, as previously discussed, in the embodiment of FIG. 4B, the internal output of the logic circuit 104 changes from the low voltage level to the high voltage level during the clock cycle (i.e., the output of the logical circuit 104 is supposed to change during the clock cycle), as illustrated in FIG. 4B. For example, in FIG. 4B, after a delay from time t0, the internal output of the logic circuit 104 starts increasing. By time t1, the internal output of the logic circuit 104 contributes to driving the output 124. Accordingly, after time t1 (i.e., when the negative pulse of the output 132 ends), the output 124 becomes sufficiently high (e.g., high enough to be considered as 1 by one or more of the logic gates). Also, after time t1, the output of the inverter 212 becomes 0, and the output of the NAND gate 216 is 1. Also after time t1, the output of the NOR gate 224 is 0. Hence, from time t1, the output of the NAND gate 220 becomes 1 and the P-channel transistor 230 turns off (i.e., is unable to further drive or sustain the output 124 to the high voltage level). Also, the output of the NOR gate 228 is 0, as a result of which the N-channel transistor 236 is also off. However, the internal output of the logic circuit 104 becomes sufficiently high by time t1 that is drives the output 124 to the high voltage level, as illustrated in FIG. 4B.

In both FIGS. 4A and 4B, the output inversion module 108 partially inverts the output 124, e.g., by driving the output 124 from the low voltage level to an intermediate voltage level. Subsequently, based on whether or not the internal output of the logic circuit 104 changes from the low voltage level to the high voltage level, (i) the partial inversion is continued such that the output 124 is eventually driven to the high voltage level by the internal output of the logic circuit 104 (e.g., as illustrated in FIG. 4B), or (ii) the partial inversion is reverted, such that the output 124 is driven back to the low voltage level (e.g., as illustrated in FIG. 4A).

Referring now to FIGS. 1, 2 and 4C, prior to time t0, the output 124 is at the high voltage level. Immediately after time t0 (e.g., between time t0 and time t1), the output 132 is 0 (e.g., due to the negative pulse indicating a start of the clock cycle, as discussed with respect to FIG. 3), resulting in the output of the inverter 212 being 1. Also, the output 124 is still at the high voltage level (e.g., as the internal output of the logic circuit 104 has not driven the output 124 to a different voltage level). Thus, between time t0 and time t1, the output of the NAND gate 216 is 0 and the output of the NOR gate 224 is also 0. Accordingly, between time t0 and time t1, the output of each of the NAND gate 220 and the NOR gate 228 is 1. Accordingly, substantially at or immediately after time t0, the N channel transistor 236 turns on (while the P-channel transistor 230 remains off), thereby gradually lowering the output 124 from the high voltage level to the intermediate voltage level (e.g., based on coupling the output 124 to the ground terminal), where the intermediate voltage level is between the high and low voltage levels of the output 124.

Also, as previously discussed, in the embodiment of FIG. 4C, the internal output of the logic circuit 104 remains at the high voltage level throughout the clock cycle (i.e., the output of the logical circuit 104 is not supposed to change during the clock cycle). Accordingly, after time t1 (i.e., when the negative pulse of the output 132 ends), the output 132 becomes 1, the output of the inverter 212 becomes 0, the output of the NAND gate 216 becomes 1, and the output of the NOR gate 224 becomes 0. Hence, from substantially time t1, the output of the NAND gate 220 remains 1 and the P-channel transistor 230 remains off. Also, the output of the NOR gate 228 changes to 0, and the N-channel transistor 236 turns off. Accordingly, the transistor 236 is unable to further drive the output 124 to a lower voltage, and the internal output of the logic circuit 104 gradually increases the output 124 back to the high voltage level, as illustrated in FIG. 4C.

Figure 4D:
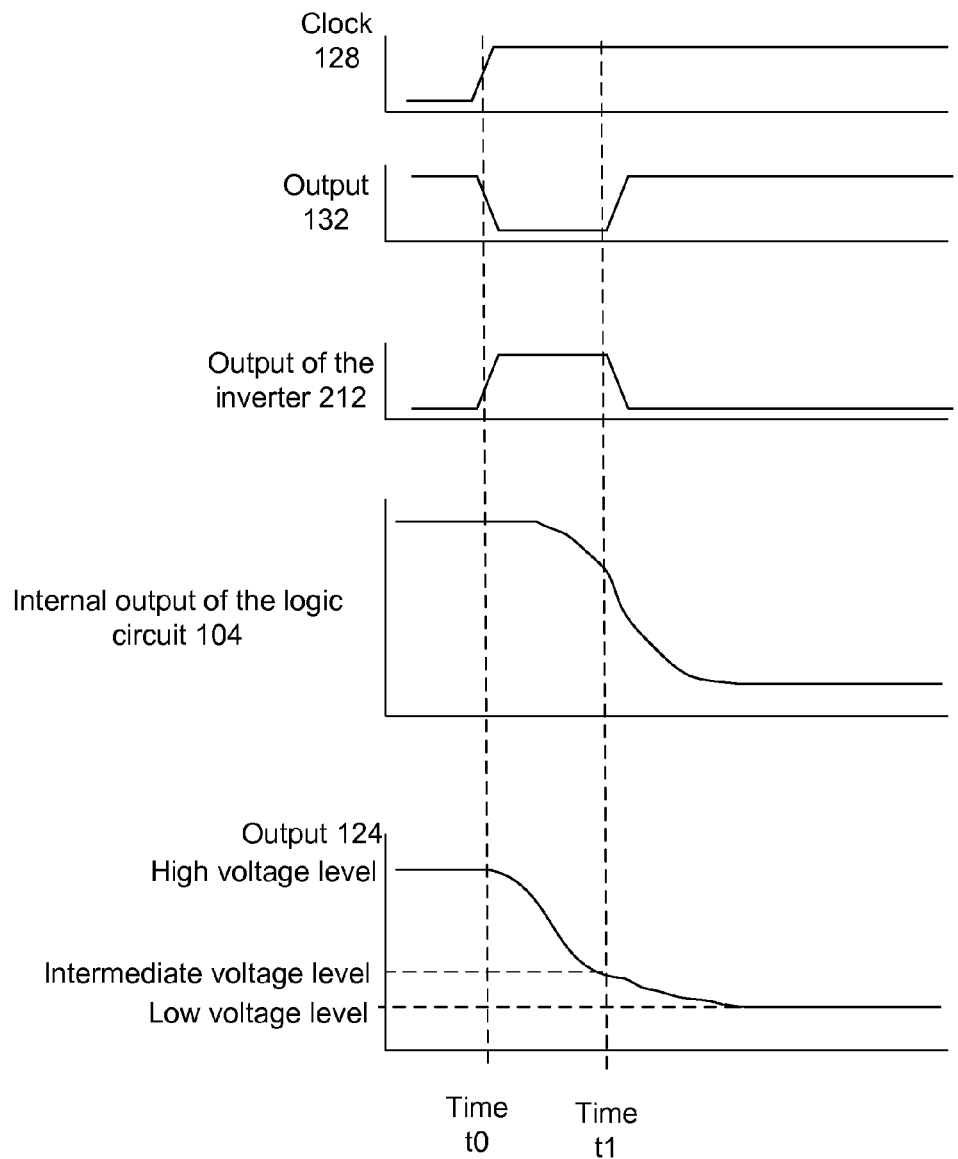

Referring now to FIGS. 1, 2 and 4D, from prior to time t0, the output 124 is at the high voltage level. Immediately after time t0 (e.g., between time t0 and time t1), the output 132 is 0 (e.g., due to the negative pulse indicating a start of the clock cycle, as discussed with respect to FIG. 3), resulting in the output of the inverter 212 being 1. Also, output 124 is still at the high voltage level (e.g., as the internal output of the logic circuit 104 has not driven the output 124 to a different voltage level). Thus, between time t0 and time t1, the output of the NAND gate 216 is 1 and the output of the NOR gate 224 is 0. Accordingly, between time t0 and time t1, the output of each of the NAND gate 220 and the NOR gate 228 is 1. Hence, substantially at or immediately after time t0, the N channel transistor 236 turns on (while the P-channel transistor 230 remains off), thereby gradually driving the output 124 from the high voltage level to the intermediate voltage level (e.g., by coupling the output 124 to the ground terminal through transistor 236), where the intermediate voltage level is between the high and low voltage levels of the output 124. It is to be noted that the behavior of the various logic gates from time t0 to time t1 is similar for both the FIGS. 4C and 4D.

Also, as previously discussed, in the embodiment of FIG. 4D, the internal output of the logic circuit 104 changes from the high voltage level to the low voltage level during the clock cycle (i.e., the output of the logical circuit 104 is supposed to change during the clock cycle), as illustrated in FIG. 4D. For example, in FIG. 4D, after a delay from time t0, the internal output of the logic circuit 104 starts decreasing. By time t1, the internal output of the logic circuit 104 contributes to driving the output 124. Accordingly, after time t1 (i.e., when the negative pulse of the output 132 ends), the output 124 becomes sufficiently low. Also, after time t1, the output of the inverter 212 becomes 0, and the output of the NAND gate 216 is 1. Also after time t1, the output of the NOR gate 224 is 0. Hence, from time t1, the output of the NAND gate 220 becomes 1 and the output of the NOR gate 228 becomes 0. Accordingly, the N-channel transistor 236 turns off (i.e., is unable to further drive down the output 124). Also, the P-channel transistor 230 remains off. However, the internal output of the logic circuit 104 becomes sufficiently low by time t1 so as to drive the output 124 to the low voltage level, as illustrated in FIG. 4D.

In both FIGS. 4C and 4D, the output inversion module 108 partially inverts the output 124, e.g., by driving the output 124 from the high voltage level to an intermediate voltage level. Subsequently, based on whether or not the internal output of the logic circuit 104 changes from the high voltage level to the low voltage level, (i) the partial inversion is continued such that the output 124 is eventually driven to the low voltage level by the internal output of the logic circuit 104 (e.g., as illustrated in FIG. 4D), or (ii) the partial inversion is reverted, such that the output 124 is driven back to the high voltage level (e.g., as illustrated in FIG. 4C).

The partial inversion of the output 124 (e.g., which is achieved by selectively coupling the output 124 to one of Vcc and ground by transistors 230 and 236, respectively), results in a faster change in the output 124, when the logic circuit 104 is to change the output 124, e.g., as illustrated in FIGS. 4B and 4D. Thus, the partial inversion of the output 124 speeds up the response time needed by the logic circuit 104 to change its output, thereby increasing a switching speed of the logic circuit 104.

It is to be noted that each of FIGS. 4A-4D illustrate a corresponding intermediate voltage level (i.e., the voltage level achieved at time t1). However, the intermediate voltage level is not the same for each of these four figures. For example, in FIG. 4A the intermediate voltage level is achieved only based on the P-channel transistor 230 coupling the output 124 to voltage Vcc; while in FIG. 4B the intermediate voltage level is achieved based on (i) the P-channel transistor 230 coupling the output 124 to VCC and (ii) the internal output of the logic circuit 104 contributing to the increase in the output 124. Accordingly, the intermediate voltage level of FIG. 4B is higher than the intermediate voltage level of FIG. 4A.

Referring again to FIG. 2, as previously discussed, in an embodiment, the NAND gate 216 has a relatively low skew and a relatively low trip point, and the NOR gate 224 has a relatively high skew and a relatively high trip point. A low skew gate considers an input, which is slightly less than or equal to half of a supply voltage, as having a logic value of 1; while a low skew gate considers an input, which is slightly more than or equal to half of the supply voltage, as having a logic value of 0. The NAND gate 216 and the NOR gate 224 creates a region of voltage where these two gates have opposing outputs. When enabled (e.g., when the output 132 is 0 and the output of the inverter 212 is 1), both the NAND gate 216 and the NOR gate 224 serve at least in part as inverters. For example, if the output 124 is 0 and the output 132 is 0, both the NAND gate 216 and the NOR gate 224 will output 1 (and vise verse). But if the output 124 is about a mid supply voltage level and the output 132 is 0, then the NAND gate 216 interprets the output 124 as 1, and as a result, outputs 0 (e.g., as the NAND gate 216 has a relatively low skew and a relatively low trip point). On the other hand, if the output 124 is about a mid supply voltage level and the output 132 is 0, then the NOR gate 224 interprets the output 124 as 0, and as a result, outputs 1 (e.g., as the NOR gate 224 has a relatively high skew and a relatively high trip point). Thus, the relative difference in the skew and trip points of the NAND gate 216 and the NOR gate 224 ensures the partial inversion of the output 124, and ensures selectively converting the partial inversion to a full inversion or reverting back the partial inversion, based on the output of the logic circuit 104, as previously discussed.

Figure 5:
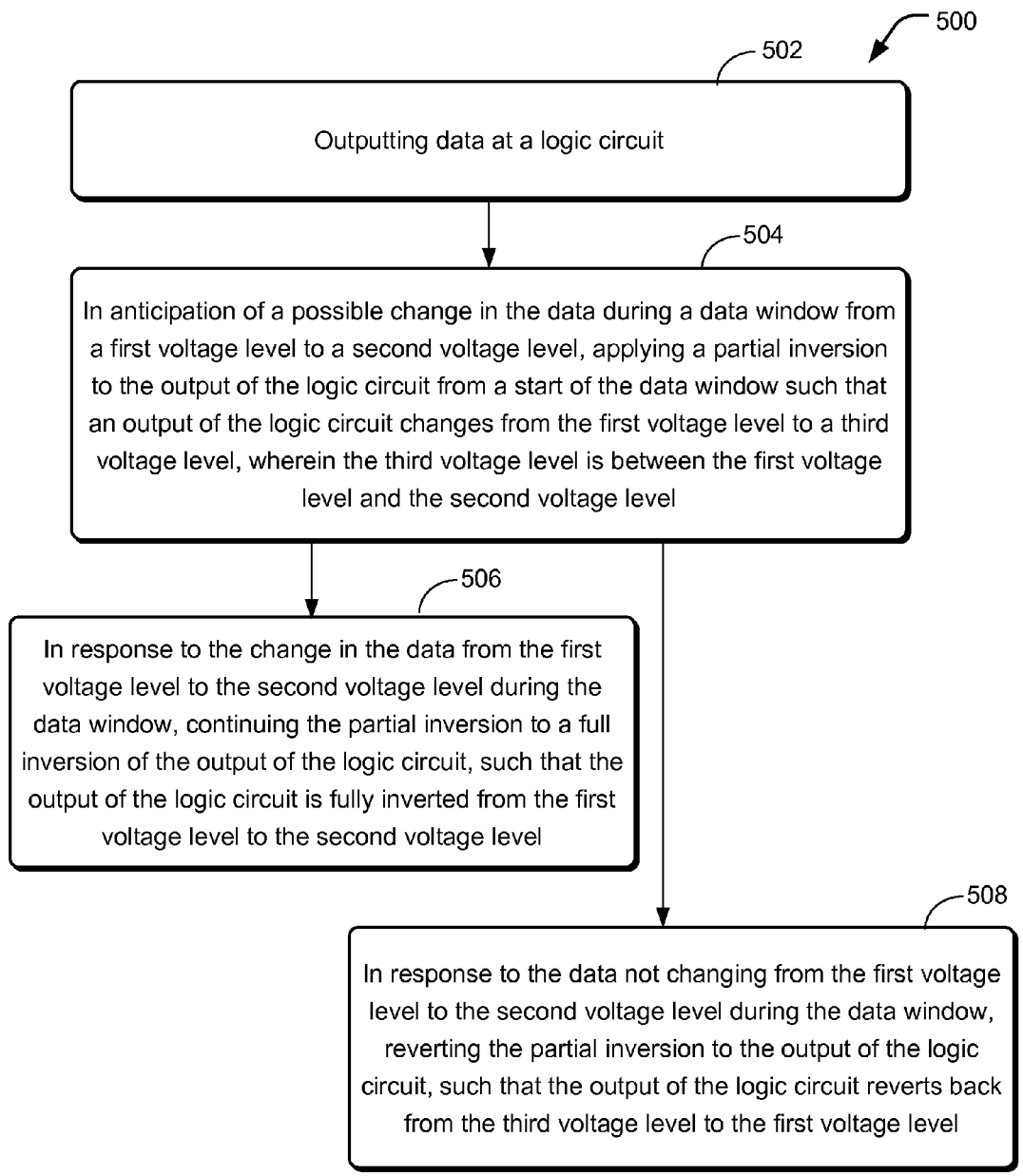
FIG. 5 illustrates an example method for operating the system of FIGS. 1 and 2, in accordance with an embodiment.

FIG. 5 illustrates an example method 500 for operating the system 100 of FIGS. 1 and 2. At 502, data (e.g., internal output of the logic circuit 104) is output at a logic circuit (e.g., logic circuit 104). At 504, in anticipation of a possible change in the data during a data window (e.g., a clock cycle) from a first voltage level (e.g., a low voltage level) to a second voltage level (e.g., a high voltage level), a partial inversion is applied (e.g., by the output inversion module 108) to an output of the logic circuit from a start of the data window such that the output of the logic circuit changes from the first voltage level to a third voltage level (e.g., an intermediate voltage level), where the third voltage level is between the first voltage level and the second voltage level.

Subsequent to 504, at 506, in response to the change in the data from the first voltage level to the second voltage level during the data window, the partial inversion is continued (e.g., using the internal output of the logic circuit 104) to a full inversion of the output of the logic circuit, such that the output of the logic circuit is fully inverted from the first voltage level to the second voltage level. On the other hand, subsequent to 504, at 508, in response to the data not changing from the first voltage level to the second voltage level during the data window, the partial inversion is reverted, such that the output of the logic circuit reverts back from the third voltage level to the first voltage level.

Figure 6:
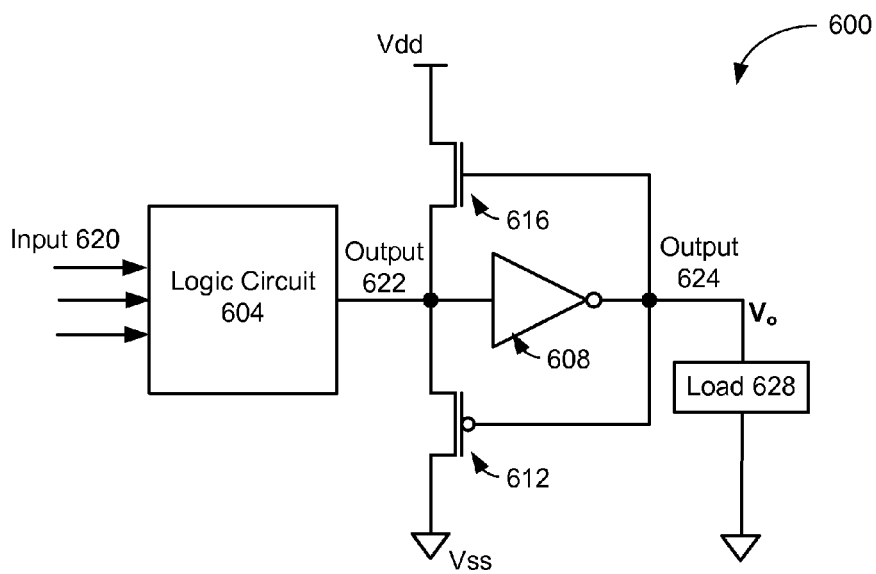
FIG. 6 schematically illustrates a system comprising (i) a logic circuit, (ii) an inverting logic gate coupled to an output of the logic circuit, and (iii) a pair of complementary transistors arranged around the inverting logic gate, in accordance with an embodiment.

Increasing Switching Speed of a Logic Circuit Using Transistor Pairs Coupled to the Logic Circuit Output FIG. 6 schematically illustrates a system 600 comprising (i) a logic circuit 604, (ii) an inverting logic gate 608 (henceforth referred to as an inverter 608) coupled to an output of the logic circuit 604, and (iii) a pair of complementary transistors 612 and 616 arranged around the inverter 608. The logic circuit 604 receives one or more input signals, labeled as input 620 in FIG. 6. Based on input 620, the logic circuit 604 drives an output 622 of the logic circuit 604. The logic circuit 604 can be any appropriate type of logic circuit comprising various logic elements, logic gates, digital circuit elements, and/or the like. The inverter 608 outputs an output 624 having a voltage Vo. A load 628 is coupled to the output 624.

In an embodiment, the logic circuit 604 has low driving capacity and/or is slow in changing the output 622 of the logic circuit 604. For example, based on the input 620, the logic circuit 604 may need to change the output 622 to a high voltage level from a start of a clock signal. However, due to, for example, low driving capacity of the logic circuit 604, slow response time of the logic circuit 604, inherent parasitic capacitance of the logic circuit 604, delay in change in the input 620, large number of input 620, large size of the logic circuit 604 and/or the like, the logic circuit 604 may start changing the output 622 to the high voltage level after some delay from the start of the clock cycle. In a complex and high frequency system, such a delay in changing the output 622 of the logic circuit 604 is generally not desirable.

In an embodiment, the inverter 608 buffers the output 622 of the logic circuit 604, in order to drive the external load 628. In an embodiment, the load 628 is a capacitive load. As the inverter 608 is a relatively simple function, the inverter 608 is used for driving the load 628 (e.g., instead of a more complex and slow driver circuit).

In an embodiment, the transistors 612 and 616 are complementary transistors. In an example, one of the transistors 612 and 616 is a NMOS transistors operating in a first region of the output 624 and another is a PMOS transistors operating in a second region of the output 624. In an embodiment, the transistor 616 is an NMOS transistor having a first terminal (e.g., a drain terminal) coupled to a voltage Vdd, a second terminal (e.g., a source terminal) coupled to the output 622, and a control terminal (e.g., a gate terminal) coupled to the output 624. In an embodiment, the transistor 612 is a PMOS transistor having a first terminal (e.g., a source terminal) coupled to the output 622, a second terminal (e.g., a drain terminal) coupled to a voltage Vss (which may be, for example, a ground terminal), and a control terminal (e.g., a gate terminal) coupled to the output 624.

Figure 7:
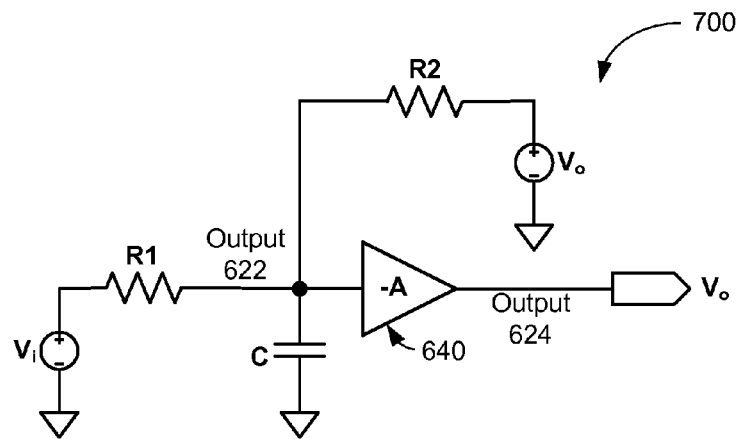
FIG. 7 illustrates a small-signal equivalent circuit of the system of FIG. 6, in accordance with an embodiment.

FIG. 7 illustrates a small-signal equivalent circuit 700 of the system 600 of FIG. 6. Referring to FIGS. 6 and 7, a voltage source Vi of FIG. 7 represents an output voltage of the logic circuit (i.e., a voltage of the output 622), a resistor R1 of FIG. 7 represents an equivalent output resistance of the logic circuit 604, and a capacitance C represents an equivalent capacitance at an interface between the logic circuit 604 and the inverter 608. The capacitance C comprises an output capacitance of the logic circuit 604, an interconnect capacitance between the logic circuit 604 and the inverter 608, an input capacitance of the inverter 622, and/or the like. In FIG. 7, an amplifier 640, with a gain of −A, represents the inverter 608. A voltage source Vo of FIG. 7 is identical to the output voltage Vo of the output 624. The resistor R2 of FIG. 7 represents the two transistors 612 and 616 of FIG. 6.

In an embodiment, the two transistors 612 and 616 comprise a source-follower circuit, so that the outputs (e.g., the source terminals) of the two transistors output a voltage approximately equal to a voltage that is input to the gate terminals of the two transistors 612 and 616. The two transistors 612 and 616 also have series resistances, so that the two transistors 612 and 616 implement the resistor and voltage source equivalence of FIG. 7.

In an embodiment, the two transistors 612 and 616 do not conduct together (e.g., at the same time). Instead, for example, the two transistors 612 and 616 conduct in different regions of the switching range of the inverter 608. For example, the transistor 612 conducts in a region where the output 624 of the inverter 608 switches substantially between Vss and (Vdd/2−|VTP|), where |VTP| is an absolute value of a threshold voltage of the transistor 612. In an example, the transistor 616 conducts in a region where the output 624 of the inverter 608 switches substantially between Vdd and (Vdd/2+|VTN|), where |VTN| is an absolute value of a threshold voltage the transistor 616. In an embodiment, in a region between (Vdd/2+|VTN|) and (Vdd/2−|VTP|), none of the transistors 612 and 616 conduct.

The source-follower circuit comprising transistors 612 and 616 consumes power. In an embodiment, this power is taken into account while designing the system 600. For example, a way to reduce this power is to turn the transistors 612 and 616 off when the gate terminal of the transistors 612 and 616 are not used. For example, the gate terminals of the transistors 612 and 616 are disconnected from the output 624, and the gate terminal of the transistor 616 is connected to the voltage Vss and the gate terminal of the transistor 612 is connected to the voltage Vdd.

Performing a small-signal analysis of the circuit of FIG. 7 results in the following input-output transfer function:

$$\frac{V_o}{V_i} = -\frac{R2}{R1 + \frac{R1+R2}{A} + s \cdot \frac{R1 \cdot R2 \cdot C}{A}} \qquad \text{Equation 1}$$

Assuming that A$\gg$1, Equation 1 may be simplified to $$\frac{V_o}{V_i} \approx -\frac{R2}{R1} \cdot \frac{1}{1 + s \cdot \frac{R2 \cdot C}{A}} = -\frac{R2}{R1} \cdot \frac{1}{1 + s \cdot \tau'}, \qquad \text{Equation 2}$$

where s is the Laplace Variable and $\tau'$=R2·C/A is the time constant of the circuit of FIG. 7. Thus, as seen in Equation 2, introduction of the resistor R2 in FIG. 7 (i.e., introduction of the transistors 612 and 616 in FIG. 6) speeds up a response time of the system 600. Assume a conventional circuit (not illustrated in the figures) that is similar to the system 600 of FIG. 6, but without the transistors 612 and 616 (i.e., similar to the circuit 700 of FIG. 7, but without the resistor R2). Also assume that the conventional circuit has a time constant of $\tau$. It can be shown that the time constant of $\tau'$ of FIGS. 6 and 7 is reduced by a factor of $\tau/\tau'$=R1*C/(R2*C/A)=A*(R1/R2), where $\tau$ is the time constant of the conventional circuit, and $\tau'$ is the time constant of the system 600 and circuit 700 of FIGS. 6 and 7. Furthermore, it can also be shown that the transfer function amplification factor of the system 600 and circuit 700 of FIGS. 6 and 7 is reduced by a factor of (−A)/(−R2/R1) =A*(R1/R2) (i.e., by the same factor as the time constant)

with respect to that of the above discussed conventional circuit. In an embodiment, R1≈R2, so the time-constant reduction factor is substantially equal to A.

Furthermore, as illustrated in the circuit 700, one terminal of resistor R2 has been disconnected from the output 624 (e.g., the terminal of the resistor is connected to a voltage source Vo that is a replica of the voltage Vo of the output 624). Thus, in FIGS. 6 and 7, the inverter 608 is not loaded down by the resistor R2. As a result, an amplitude of the voltage of the output 624 is not degraded or adversely affected by the resistor R2 (i.e., by the transistors 612 and 616), and the output 624 can be connected freely to external circuit elements (e.g., to the external load 628). That is, in FIGS. 6 and 7, an output swing (i.e., a swing in the output 624) is not decreased by the transistors 612 and 616. Thus, the pair of complementary transistors 612 and 616 is coupled to the outputs 622 and 624 of the system 600 and are arranged in a negative feedback loop surrounding the inverter 608, so as to replace current obtained from the charge/discharge of the capacitive load on the output 622 of the logic circuit 604 with current provided by the complimentary transistors (e.g., resulting in a faster switching of the logic circuit 604), without loading the inverter 608 (e.g., without decreasing the swing of the output 624). Put differently, the transistors 612 and 616 (e.g., the equivalent resistor R2 in FIG. 7) at least in part cancels an effect of the inherent parasitic capacitance of the logic circuit 604 (e.g., by diverting charge/discharge current from the capacitive load on the output 622 of the logic circuit 604), thereby speeding up the system 600—without loading the inverter 608, and therefore, without decreasing an output voltage swing of the output 624.

Figure 8:
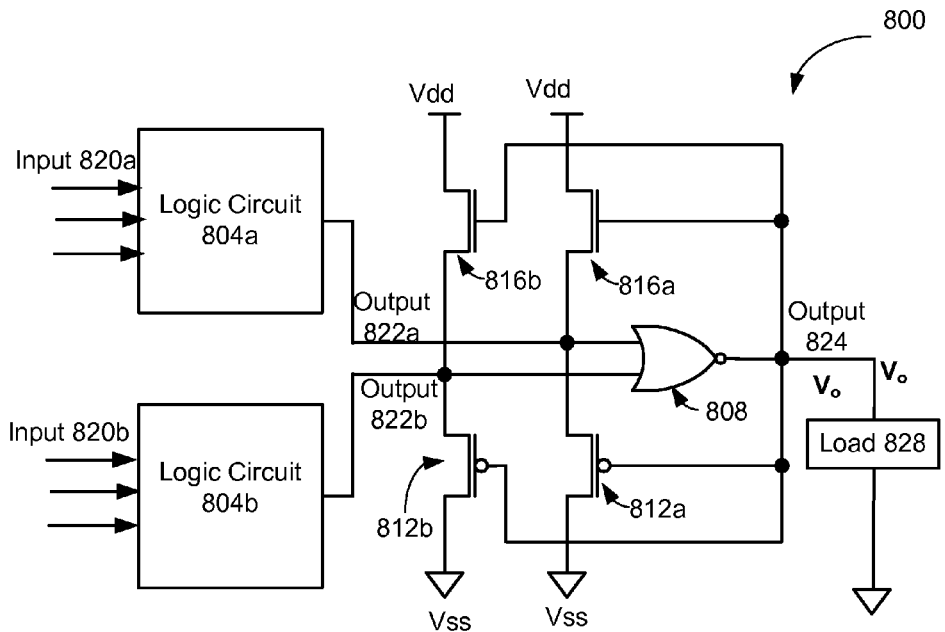
FIG. 8 schematically illustrates a system comprising (i) a first logic circuit and a second logic circuit, and (ii) a NOR gate receiving (A) a first output from the first logic circuit and (B) a second output from the second logic circuit, in accordance with an embodiment.

In the system 600 of FIG. 6, a single logic circuit 604 is present. However, in an embodiment, more than one logic circuit may be present in a system. FIG. 8 schematically illustrates a system 800 comprising (i) a first logic circuit 804a and a second logic circuit 804b, and (ii) a NOR gate 808 receiving (A) a first output 822a from the first logic circuit 804a and (B) a second output 822b from the second logic circuit 804b. The inverter 608 in the system 600 of FIG. 6 is replaced by the NOR gate 808 in the system 800 of FIG. 8. An output 824 of the NOR gate 808 is received by a load 828.

In an embodiment, (i) a first pair of complementary transistors 812a and 816a are arranged around the NOR gate 808, i.e., around the outputs 824 and 822a; and (ii) a second pair of complementary transistors 812b and 816b are arranged around the NOR gate 808, i.e., around the outputs 824 and 822b. In an embodiment, each of the first pair of complementary transistors 812a and 816a and the second pair of complementary transistors 812b and 816b of FIG. 8 operate in a manner that is in part similar to the operation of the pair of complementary transistors 612 and 616 of FIG. 6. For example, the first pair of complementary transistors 812a and 816a operate as a source-follower circuit for the outputs 824 and 822a; and the second pair of complementary transistors 812b and 816b operate as a source-follower circuit for the outputs 824 and 822b. The operation of each of the first pair of complementary transistors 812a and 816a and the second pair of complementary transistors 812b and 816b of FIG. 8 will be evident from the operation of the pair of complementary transistors 612 and 616 of FIG. 6. Accordingly, a detailed discussion on the operation of the system 800 of FIG. 8 is not provided herein.

Similar to the pair of complementary transistors 612 and 616 of FIG. 6, the first pair of complementary transistors 812a and 816a of FIG. 8 at least in part cancels an effect of an inherent parasitic capacitance of the logic circuit 804a (e.g., by diverting charge/discharge current from the output 822a of the logic circuit 804a), thereby speeding up the output of the logic circuit 804a—without loading the NOR gate 808, and therefore, without decreasing an output voltage swing of the output 824. The second pair of complementary transistors 812b and 816b of FIG. 8 also operate in a similar manner, and increases the switching time of the logic circuit 804b.

Although only two logic circuits (and two corresponding pairs of complementary transistors) are illustrated in FIG. 8, in an embodiment, more than two logic circuits (and more than two corresponding pairs of complementary transistors) may be present in the system 800 of FIG. 8. In such an embodiment, the NOR gate 808 receives more than two inputs respectively from the more than two logic circuits.

Figure 9:
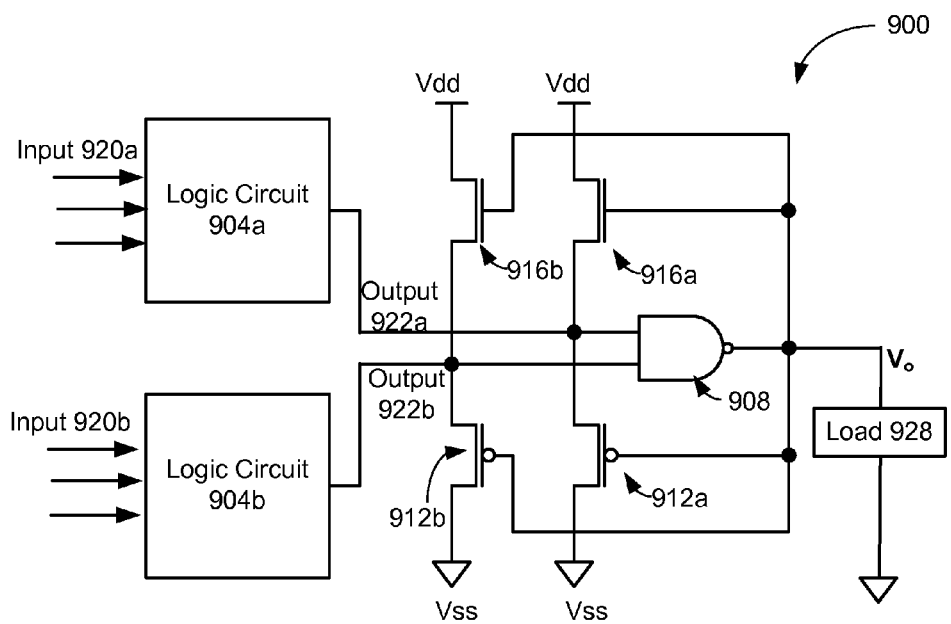
FIG. 9 schematically illustrates a system comprising (i) a first logic circuit and a second logic circuit, and (ii) a NAND gate receiving (A) a first output from the first logic circuit and (B) a second output from the second logic circuit, in accordance with an embodiment.

FIG. 9 schematically illustrates a system 900 comprising (i) a first logic circuit 904a and a second logic circuit 904b, and (ii) a NAND gate 908 receiving (A) a first output 922a from the first logic circuit 904a and (B) a second output 922b from the second logic circuit 904b. The system 900 is in part similar to the system 800 of FIG. 8. However, the NOR gate 808 in FIG. 8 is replaced by the NAND gate 908 in FIG. 9.

An operation of the system 900 of FIG. 9 will be evident from the operation of the systems 600 and 800 of FIGS. 6 and 8. For example, similar to the pair of complementary transistors 612 and 616 of FIG. 6, the first pair of complementary transistors 912a and 916a of FIG. 9 at least in part cancels an effect of an inherent parasitic capacitance of the logic circuit 904a (e.g., by diverting charge/discharge current from the output 922a of the logic circuit 904a), thereby speeding up the output of the logic circuit 904a—without loading the NAND gate 908, and therefore, without decreasing an output voltage swing of the output 924. The second pair of complementary transistors 912b and 916b of FIG. 9 also operate in a similar manner, and increases the switching time of the logic circuit 904b.

Although only two logic circuits (and two corresponding pairs of complementary transistors) are illustrated in FIG. 9, in an embodiment, more than two logic circuits (and more than two corresponding pairs of complementary transistors) may be present in the system 900 of FIG. 9. In such an embodiment, the NAND gate 908 receives more than two inputs respectively from the more than two logic circuits.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method comprising:
outputting data at a logic circuit;
based on a possible change in the data during a data window from a first voltage level to a second voltage level, applying at least a partial inversion to an output of the logic circuit from a start of the data window such that the output of the logic circuit changes from the first voltage level to a third voltage level that is different from the first and second voltage levels; and
modifying a level of at least the partial inversion responsively to whether or not the data changes during the data window.

2. The method of claim 1, wherein prior to the start of the data window, the output of the logic circuit is at the first voltage level, and wherein applying at least the partial inversion to the output of the logic circuit from the start of the data window further comprises:
based on the possible change in the data during the data window from the first voltage level to the second voltage level, applying the partial inversion to the output of the logic circuit from the start of the data window such that the output of the logic circuit changes from the first voltage level to the third voltage level that is between the first voltage level and the second voltage level.

3. The method of claim 2, further comprising:
in response to the change in the data from the first voltage level to the second voltage level during the data window, continuing the partial inversion to a full inversion of the output of the logic circuit, such that the output of the logic circuit is fully inverted from the first voltage level to the second voltage level.

4. The method of claim 2, further comprising:
in response to the data not changing from the first voltage level to the second voltage level during the data window, reverting the partial inversion to the output of the logic circuit, such that the output of the logic circuit reverts back from the third voltage level to the first voltage level.

5. The method of claim 2, wherein the first voltage level is a low voltage level and the second voltage level is a high voltage level, and wherein applying at least the partial inversion further comprises:
during a first portion of the data window that starts from the start of the data window, applying at least the partial inversion to the output of the logic circuit by (i) electrically coupling the output of the logic circuit to a voltage source and (ii) driving the output of the logic circuit to the third voltage level using the voltage source,
wherein the method further comprises:
subsequent to an end of the first portion of the data window, disconnecting the voltage source from the output of the logic circuit.

6. The method of claim 5, further comprising:
subsequent to (i) the end of the first portion of the data window and (ii) disconnecting the voltage source from the output of the logic circuit, performing one of:
in response to the change in the data from the first voltage level to the second voltage level during the data window, continuing the partial inversion to a full inversion of the output of the logic circuit, such that the output of the logic circuit is fully inverted from the first voltage level to the second voltage level, and
in response to the data not changing from the first voltage level to the second voltage level during the data window, reverting the partial inversion to the output of the logic circuit, such that the output of the logic circuit reverts back from the third voltage level to the first voltage level.

7. The method of claim 2, wherein the first voltage level is a high voltage level and the second voltage level is a low voltage level, and wherein applying at least the partial inversion further comprises:
during a first portion of the data window that starts from the start of the data window, applying at least the partial inversion to the output of the logic circuit by (i) electrically coupling the output of the logic circuit to a ground terminal and (ii) driving down the output of the logic circuit from the first voltage level to the third voltage level,
wherein the method further comprises:
subsequent to an end of the first portion of the data window, disconnecting the output of the logic circuit from the ground terminal.

8. The method of claim 1, wherein the data window is a clock cycle of a clock signal, and wherein the method further comprises:
receiving the clock signal; and
based on the clock signal, generating a pulse that indicates a start of the clock cycle,
wherein applying at least the partial inversion further comprises:
in response to receiving the pulse that indicates the start of the clock cycle, applying at least the partial inversion to the output of the logic circuit from the start of the clock cycle until at least determining if the change in the data during the data window has occurred.

9. The method of claim 1, wherein modifying the level of the at least partial inversion further comprises:
in response to the change in the data during the data window, continuing the partial inversion to a full inversion of the output of the logic circuit such that the output of the logic circuit is fully inverted from the first voltage level to the second voltage level; and
in response to the data not changing during the data window, reverting the partial inversion to the output of the logic circuit, such that the output of the logic circuit reverts back from the third voltage level to the first voltage level.

10. The method of claim 1, wherein modifying the level of the at least partial inversion further comprises:
in response to the change in the data during the data window, modifying the level of the at least partial inversion from the third voltage level to the second voltage level; and
in response to no change in the data during the data window, modifying the level of the at least partial inversion from the third voltage level to the first voltage level.

11. A system comprising:
a logic circuit configured to output data; and
an output inversion module coupled to an output of the logic circuit, the output inversion module configured to:
based on a possible change in the data during a data window from a first voltage level to a second voltage level, apply at least a partial inversion to an output of the logic circuit from the start of the data window such that the output of the logic circuit changes from the first voltage level to a third voltage level that is different from the first and second voltage levels; and
modify a level of at least the partial inversion responsively to whether or not the data changes during the data window.

12. The system of claim 11, wherein prior to the start of the data window, the output of the logic circuit is at the first voltage level, and wherein the third voltage level is between the first voltage level and the second voltage level.

13. The system of claim 12, wherein the logic circuit is configured to:
in response to the change in the data from the first voltage level to the second voltage level during the data window, continue the partial inversion to a full inversion of the output of the logic circuit, such that the output of the logic circuit is fully inverted from the first voltage level to the second voltage level.

14. The system of claim 12, wherein the logic circuit is configured to:
in response to the data not changing from the first voltage level to the second voltage level during the data window, revert the partial inversion to the output of the logic circuit, such that the output of the logic circuit reverts back from the third voltage level to the first voltage level.

15. The system of claim 12, wherein the first voltage level is a low voltage level and the second voltage level is a high voltage level, and wherein the output inversion module is configured to apply at least the partial inversion by:
during a first portion of the data window that starts from the start of the data window, (i) electrically coupling the output of the logic circuit to a voltage source of the output inversion module and (ii) driving the output of the logic circuit to the third voltage level using the voltage source,
wherein the output inversion module is further configured to:
subsequent to an end of the first portion of the data window, disconnect the voltage source from the output of the logic circuit.

16. The system of claim 12, wherein the first voltage level is a high voltage level and the second voltage level is a low voltage level, and wherein the output inversion module is configured to apply at least the partial inversion by:
during a first portion of the data window that starts from the start of the data window, (i) electrically coupling the output of the logic circuit to a ground terminal and (ii) driving down the output of the logic circuit from the first voltage level to the third voltage level,
wherein the output inversion module is further configured to:
subsequent to an end of the first portion of the data window, disconnect the output of the logic circuit from the ground terminal.

17. The system of claim 11, wherein the data window is a clock cycle of a clock signal, and wherein the system further comprises:
a pulse generation module configured to (i) receive the clock signal, and (ii) based on the clock signal, generate a pulse that indicates a start of the clock cycle,
wherein the output inversion module is configured to apply at least the partial inversion by:
in response to receiving the pulse that indicates the start of the clock cycle, applying at least the partial inversion to the output of the logic circuit from the start of the clock cycle.

18. The system of claim 17, wherein the output inversion module comprises:
an inverter configured to receive an output of the pulse generation module;
a first NAND gate configured to receive (i) an output of the inverter and (ii) the output of the logic circuit;
a first NOR gate configured to receive (i) an output of the pulse generation module and (ii) the output of the logic circuit;
a second NAND gate configured to receive (i) an output of the first NAND gate and (ii) an output of the first NOR gate;
a second NOR gate configured to receive (i) the output of the first NAND gate and (ii) the output of the first NOR gate;
a first transistor having (i) a control terminal coupled to an output of the second NAND gate, (ii) a first terminal coupled to a voltage source, and (iii) a second terminal coupled to the output of the logic circuit; and
a second transistor having (i) a control terminal coupled to an output of the second NOR gate, (ii) a first terminal coupled to a ground terminal, and (iii) a second terminal coupled to the output of the logic circuit.

19. The system of claim 11, further comprising:
a voltage source, wherein the output inversion module is configured to:
couple the output of the logic circuit to the voltage source from the start of the data window, resulting in least the partial inversion to the output of the logic circuit from the start of the data window; and
disconnect the voltage source from the output of the logic circuit subsequent to the partial inversion to the output of the logic circuit.

* * * * *